(12) United States Patent
Ammar et al.

(10) Patent No.: US 6,788,171 B2
(45) Date of Patent: Sep. 7, 2004

(54) MILLIMETER WAVE (MMW) RADIO FREQUENCY TRANSCEIVER MODULE AND METHOD OF FORMING SAME

(75) Inventors: Danny F. Ammar, Windermere, FL (US); Eugene Fischer, Clermont, FL (US); Gavin Clark, Tavares, FL (US); John Hubert, Clermont, FL (US); Glenn Larson, Winter Garden, FL (US)

(73) Assignee: Xytrans, Inc., Orlando, FL (US)

( * ) Notice: Subject to any disclaimer, the term of this patent is extended or adjusted under 35 U.S.C. 154(b) by 48 days.

(21) Appl. No.: 10/091,382

(22) Filed: Mar. 5, 2002

(65) Prior Publication Data

US 2003/0169134 A1 Sep. 11, 2003

(51) Int. Cl.⁷ .............................. H01P 1/00; H01P 1/20; H01P 3/08
(52) U.S. Cl. ...................... 333/247; 333/248; 333/204; 333/238
(58) Field of Search .......................... 333/246, 247, 333/248, 204, 238, 205

(56) References Cited

U.S. PATENT DOCUMENTS

| | | | |
|---|---|---|---|
| 4,867,696 A | 9/1989 | Demler, Jr. et al. | 439/212 |
| 5,065,123 A | * 11/1991 | Heckaman et al. | 333/246 |
| 5,129,832 A | 7/1992 | Marsh et al. | 439/79 |
| 5,132,648 A | 7/1992 | Trinh et al. | 333/128 |
| 5,146,453 A | 9/1992 | Nagler et al. | 370/16 |
| 5,188,534 A | 2/1993 | Bertho et al. | 439/79 |
| 5,270,673 A | 12/1993 | Fries et al. | 333/246 |
| 5,366,380 A | 11/1994 | Reymond | 439/66 |
| 5,423,080 A | 6/1995 | Perret et al. | 455/90 |
| 5,451,883 A | 9/1995 | Staab | 324/758 |
| 5,552,752 A | 9/1996 | Sturdivant et al. | 333/243 |
| 5,557,144 A | 9/1996 | Rosenstock et al. | 258/668 |
| 5,617,866 A | 4/1997 | Marian, Jr. | 128/662.3 |

(List continued on next page.)

FOREIGN PATENT DOCUMENTS

| | | | |
|---|---|---|---|
| EP | 0 901 181 A2 | 3/1999 | H01P/5/08 |
| WO | WO 02/23674 A2 | 3/2002 | H01Q/21/00 |

OTHER PUBLICATIONS

U.S. patent application Publication US 20002/0171141 A1 of Ammar.*

U.S. patent application Publication US 20002/0030250 A1 of Ammar.*

Prabhu, et al., "Co-Fired Ceramic on Metal Multichip Modules for Advanced Military Packaging," Aerospace and Electronics Conference, Proceedings of the IEEE, May 24, 1993, pp. 217–222.

Jayaraj, et al., "RF Characterization of a Low Cost Multi-chip Packaging Technology For Monolithic Microwave and Millimeter Wave Integrated Circuits," Signals, Systems and Electronics, International Symposium on San Francisco, Oct. 25, 1995, pp. 443–446.

Gutierrez, et al., "A Thick Film Package for Microwave ICs," Proceedings of the Electronic Component and Technology Conference, May 18, 1992, pp. 151–156.

Primary Examiner—Patricia Nguyen
(74) Attorney, Agent, or Firm—Allen, Dyer, Doppelt, Milbrath & Gilchrist, P.A.

(57) ABSTRACT

A low cost and high performance millimeter wave (MMW) radio frequency transceiver module includes a substrate board and plurality of microwave monolithic integrated circuit (MMIC) chips supported by the substrate board and arranged in a receiver section, a local oscillator section and a transmitter section. A plurality of filters and radio frequency circuit interconnects are formed on the substrate board and operative with and/or connecting the receiver, local oscillator and transmitter sections. A plurality of electrical interconnects are operative with and connect the receiver, local oscillator and transmitter sections. A method of forming the millimeter wave radio frequency transceiver module is also disclosed.

52 Claims, 7 Drawing Sheets

U.S. PATENT DOCUMENTS

| | | | |
|---|---|---|---|
| 5,619,399 A | 4/1997 | Mok | 361/707 |
| 5,631,446 A | 5/1997 | Quan | 174/254 |
| 5,639,263 A | 6/1997 | Zell et al. | 439/608 |
| 5,641,314 A | 6/1997 | Broschard, III et al. | 439/751 |
| 5,745,076 A | 4/1998 | Turlington et al. | 342/372 |
| 5,820,549 A | 10/1998 | Marian, Jr. | 600/437 |
| 5,823,790 A | 10/1998 | Magnuson | 439/63 |
| 5,834,335 A | 11/1998 | Buschbom | 438/107 |
| 5,886,590 A | 3/1999 | Quan et al. | 333/33 |
| 5,948,960 A | 9/1999 | Langmack et al. | 73/1.88 |
| 5,982,186 A | 11/1999 | Buschbom | 324/755 |
| 5,991,165 A | 11/1999 | Jones, Jr. et al. | 361/816 |
| 6,002,920 A * | 12/1999 | Consolazio et al. | 455/82 |
| 6,040,739 A | 3/2000 | Wedeen et al. | 330/66 |
| 6,079,999 A | 6/2000 | Terry et al. | 439/329 |
| 6,099,677 A | 8/2000 | Logothetis et al. | 156/253 |
| 6,114,869 A | 9/2000 | Williams et al. | 324/765 |
| 6,137,296 A | 10/2000 | Yoon et al. | 324/754 |
| 6,192,576 B1 | 2/2001 | Tan et al. | 29/714 |
| 6,200,171 B1 | 3/2001 | Fusselman et al. | 439/736 |
| 6,215,377 B1 | 4/2001 | Douriet | 333/247 |
| 6,217,382 B1 | 4/2001 | Ziers | 439/578 |
| 6,242,933 B1 | 6/2001 | Yap | 324/755 |
| 6,248,201 B1 | 6/2001 | Boyd, IV et al. | 156/247 |
| 6,252,415 B1 | 6/2001 | Lefever et al. | 324/761 |
| 6,261,872 B1 | 7/2001 | Hathaway et al. | 438/126 |

* cited by examiner

MILLIMETER WAVE (MMW) RADIO FREQUENCY TRANSCEIVER MODULE AND METHOD OF FORMING SAME

FIELD OF THE INVENTION

This invention relates to a millimeter wave (MMW) radio frequency transceiver module using microwave monolithic integrated circuits.

BACKGROUND OF THE INVENTION

Traditionally, millimeter wave (MMW) radio frequency modules have been assembled with "chip and wire" fabrication techniques, such as shown in FIGS. 1 and 2, where microwave monolithic integrated circuit (MMIC) chips 20 along with interconnecting substrates 22, such as made from alumina or fused silica, are bonded to a coefficient of thermal expansion (CTE) matched housing 24, which is normally formed from copper tungsten (CuW) or other similar CTE matched material. Metal plate capacitors 26 are mounted on the CTE matched housing 24 and have wire bonds 28 extending between the metal plate capacitors 26 and MMIC chips 20. Ribbon bonds 30 can extend between the MMIC chips 20 and any interconnections on the substrate 22. Various electrical interconnects 31 and other components can be printed on the substrates by techniques known to those skilled in the art.

FIG. 1 shows that the coefficient of thermal expansion matched housing 24 can have subminiature coaxial connectors (SMA connectors 32) and/or waveguide interfaces. The MMIC chips 20 and the substrates are typically adhered directly to the CTE matched housing by adhesive or other means. Various waveguide or other channels 34 are formed within the housing.

A drawback of this type of prior art "chip and wire" fabrication technique is its relatively expensive cost because of a high parts count and associated assembly costs. The present assignee has also made improvements by using multilayer, low temperature, co-fired ceramic (LTCC) board techniques, including the use of low transfer tape technology, where MMIC chips are mounted to multilayer LTCC boards. Multilayer board techniques reduce fabrication costs relative to the more traditional "chip and wire" fabrication techniques. There is still room, however, for other processing techniques that are improvements over "chip and wire" techniques besides the use of multilayer, low temperature, co-fired ceramic and low temperature transfer tape board techniques.

SUMMARY OF THE INVENTION

The present invention provides an improvement over prior art "chip and wire" fabrication techniques and comprises a millimeter wave (MMW) radio frequency transceiver module that includes a substrate board. A plurality of microwave monolithic integrated circuit (MMIC) chips are supported by the substrate board and arranged in a receiver section, a local oscillator section, and a transmitter section. A plurality of filters and radio frequency interconnects are formed on the substrate board and operative with and/or connect the receiver, local oscillator and transmitter sections. A plurality of electrical interconnects are operative with and/or connect the receiver, local oscillator and transmitter sections.

In one aspect of the present invention, the electrical interconnects are printed on the substrate board. In yet another aspect of the present invention, a dielectric layer and conductive layer are formed on the substrate board opposite to the side containing the MMIC chips, filters, and radio frequency interconnects. Electrical interconnects are formed within the conductive layer. A plurality of conductive vias extend from the electrical interconnects through the substrate board to the surface having the MMIC chips, filters and radio frequency interconnects.

In yet another aspect of the present invention, a cut-out can be formed within the substrate board for receiving a MMIC chip and allowing direct attachment of the MMIC chip to a coefficient of thermal expansion (CTE) matched carrier or heat sink. At least one row of ground vias are formed within the substrate board and provide isolation between at least the transmitter and receiver sections formed on the substrate board. The transmitter, receiver and local oscillator sections can be formed substantially isolated from each other to enhance isolation and reduce possible oscillations.

In yet another aspect of the present invention, a microstrip-to-waveguide transition is formed at each of the transmitter and receiver sections. Each microstrip-to-waveguide transition includes a backshort placed relative to the substrate board and a waveguide launch operative with the backshort. The backshort and waveguide launch are isolated by a plurality of isolation vias. The substrate board can comprise a single, ceramic board and can be formed from about 90% to about 99.6% alumina and ranges from about 5 to about 20 mil thick, in one aspect of the present invention.

In yet another aspect of the present invention, the transceiver module includes a housing made of aluminum or similar material having a bottom plate and a housing cover attached to the bottom plate. The substrate board is positioned on the bottom plate and covered by the housing cover. An electromagnetic interference gasket can be mounted within the housing cover such that when the housing cover is attached to the bottom plate, the interference gasket is positioned above the substrate and around MMIC chips supported by the substrate board. Radio frequency channels can be formed in the cover and an absorbent material is operative with the channels to enhance isolation among the local oscillator, transmitter and receiver sections. The housing cover includes solderless SMA connectors having spring-loaded intermediate contacts.

A method of forming a millimeter wave (MMW) radio frequency transceiver module is also set forth. A substrate board is formed and a plurality of microwave monolithic integrated circuit (MMIC) chips are mounted on the substrate board and arranged in a receiver section, a local oscillator section, and a transmitter section. A plurality of filters and radio frequency interconnects are formed on the substrate board, such as by thick film processing techniques, and are operative with and/or connect the receiver, local oscillator and transmitter sections. Electrical interconnects are formed and are operative with and/or connect the receiver, local oscillator and transmitter sections. In one aspect of the invention, a dielectric layer and conductive layer are formed on the substrate board opposite the MMIC chips and filters and radio frequency interconnects side. Electrical interconnects are formed within a conductive layer and a plurality of conductive vias are formed to extend from the electrical interconnects through the substrate board to the surface having the MMIC chips and thick film printed filters and radio frequency interconnects.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
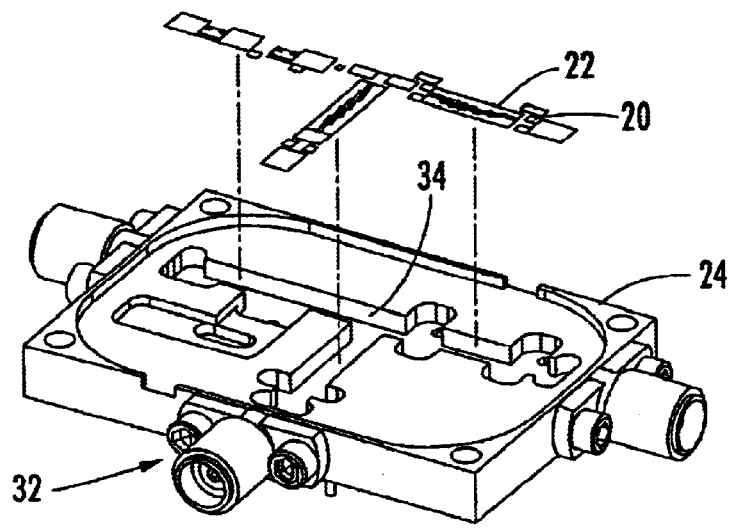
FIG. 1 is an exploded isometric view illustrating a number of MMIC chips and substrates mounted directly to a coefficient of thermal expansion matched housing as fabricated by prior art "chip and wire" techniques.
Figure 2:
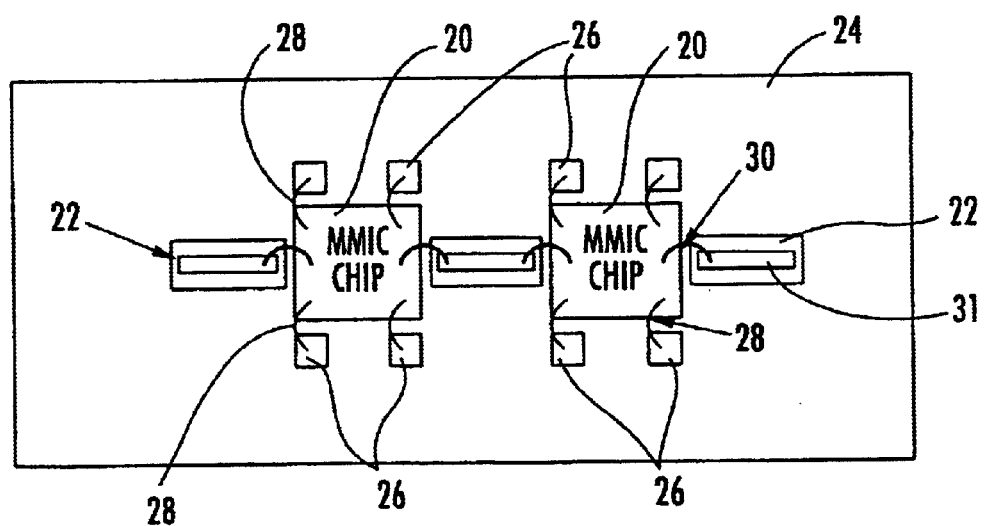
FIG. 2 is a fragmentary, plan view illustrating a typical "chip and wire" fabrication of the prior art.

The present invention is advantageous over prior art millimeter wave (MMW) modules that are assembled with "chip and wire" techniques, such as disclosed in FIGS. 1 and 2, where the MMIC chips and substrates are mounted directly to a coefficient of thermal expansion matched housing, which typically includes solderless SMA and/or waveguide interfaces. As shown in FIG. 2, numerous parts, such as metal plate capacitors, resistors, diodes, ribbon bonds, wire bonds and other associated interconnects and substrates, are necessary, adding to a high parts count, increased assembly costs, and overall expensive module costs.

The present invention provides a low cost, high performance, and high yield millimeter wave (MMW) radio frequency transceiver module and method of fabricating the module by using a single ceramic substrate board. Microwave monolithic integrated circuit (MMIC) chips are attached to the board, such as by mounting directly onto the ceramic substrate board. Any RF interconnects and filters can be printed on top of the ceramic substrate board using thick film processing techniques known to those skilled in the art. Electrical interconnects can be either printed on the top surface, or implemented in conductive layers that are separated by a dielectric material, and extending underneath the ceramic substrate board. Electrical signals can be carried to the top of the ceramic substrate board using vias. The present invention is relevant to all high frequency microwave and millimeter wave modules, including, but not limited to, radar and telecommunication applications. The module types can include, but are not limited to, transmitters, receivers, transceivers and solid state boosters.

Figure 3:
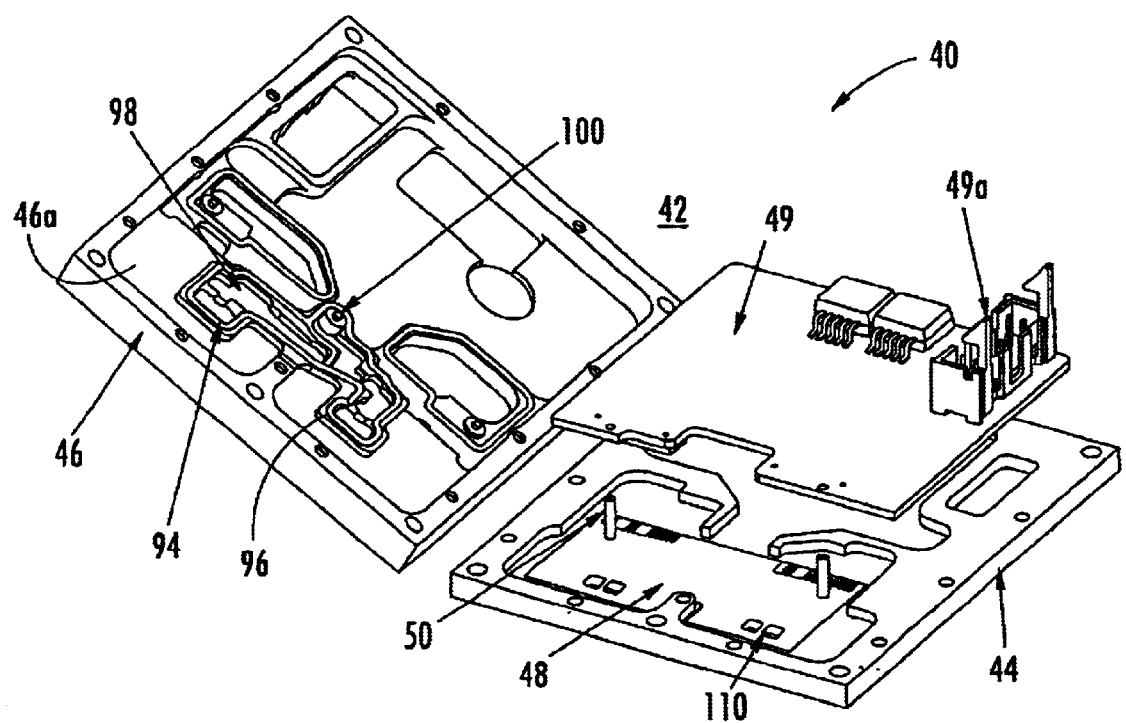
FIG. 3 is an exploded isometric view of the transceiver module of the present invention and showing a housing having a bottom plate and housing cover, a substrate board positioned on the bottom plate, and associated components of the present invention.

As shown in FIG. 3, the millimeter wave radio frequency transceiver module 40 of the present invention includes a housing 42 having a bottom plate 44 and a housing cover 46, which can be attached to the bottom plate, such as by screws or other fastener means. The housing 42 is formed by techniques known to those skilled in the art and could be formed from a metallic material having a coefficient of thermal expansion that is not necessarily matched to basic components of the transceiver module. A substrate board 48 is formed as a high frequency ceramic substrate board and mounted on the bottom plate 44. It is positioned correctly on the plate 44 by guide pins 50 that extend through guide holes 51 formed in the substrate board. A regulator control board 49, as known to those skilled in the art, is shown and having a DC connector 49a. For purposes of explanation, the description will first proceed with reference to the substrate board used in the present invention.

Figure 4:
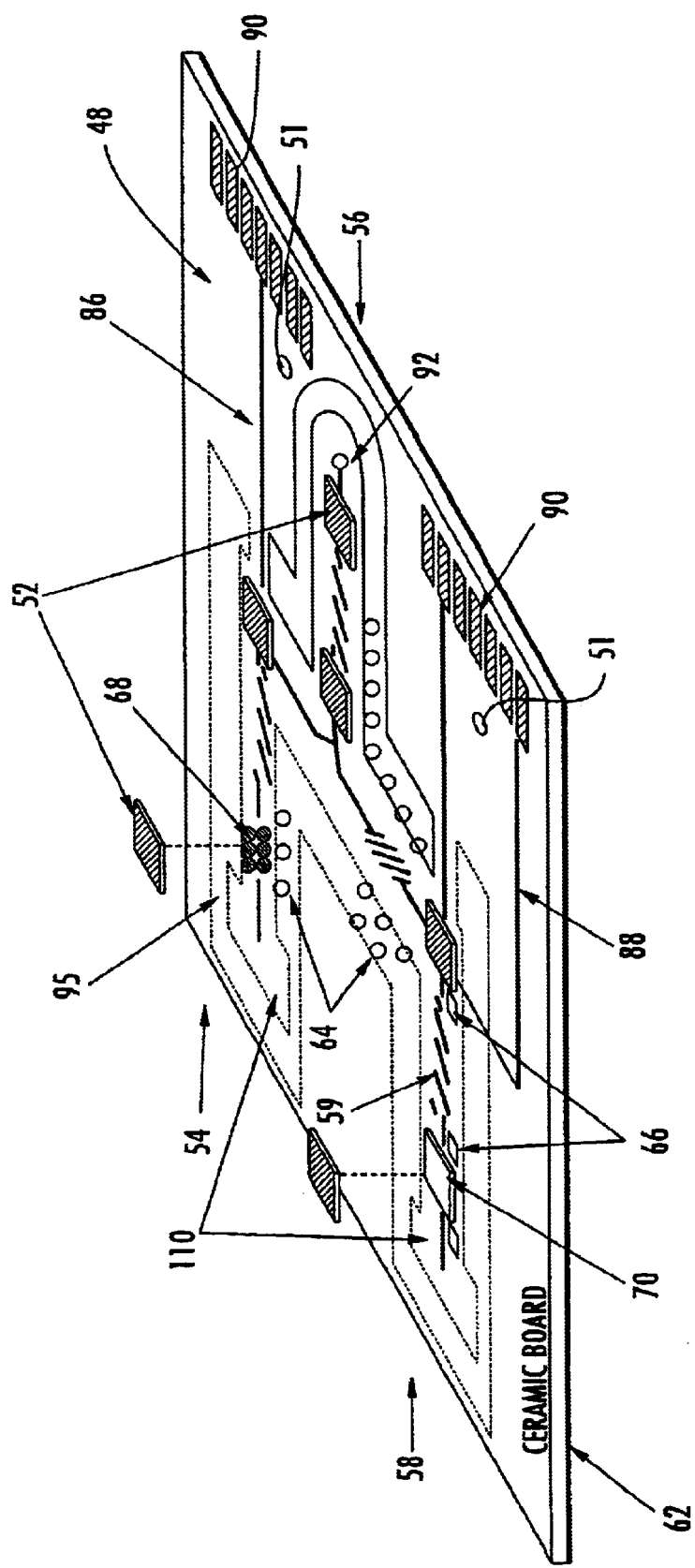
FIG. 4 is an isometric view illustrating a single, ceramic substrate board having a ground layer, and the receiver section, a local oscillator section and transmitter section of the present invention.
Figure 5:
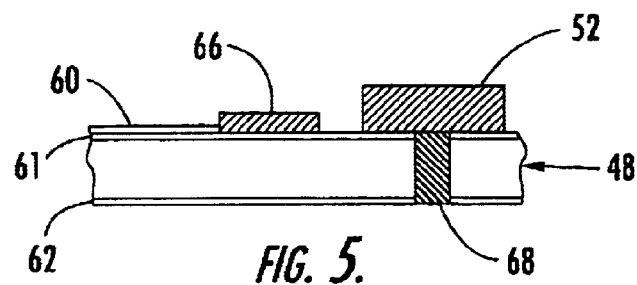
FIG. 5 is a fragmentary, sectional view of an example of a single layer ceramic board showing RF circuitry and an adhesion and RF ground layer positioned on the substrate board.

As illustrated in FIG. 4, a plurality of microwave monolithic integrated circuit (MMIC) chips 52 are supported by the substrate board 48 and arranged in a receiver section 54, a local oscillator section 56 and a transmitter section 58. A plurality of filters 59 and radio frequency interconnects are formed on the substrate board and operative with and/or connect the receiver, local oscillator and transmitter sections 54, 56, 58. Any filters 59 and radio frequency interconnects 60 are preferably formed by thick film processing techniques using methods known to those skilled in the art and are part of a top circuitry 61 (FIG. 5). A plurality of electrical interconnects are operative with and/or connect the receiver, local oscillator and transmitter sections 54, 56, 58. In one aspect of the present invention, the electrical interconnects are printed on the substrate board as part of circuitry 61 using printing techniques (including thick film techniques if desired) as known to those skilled in the art. This embodiment is shown in FIG. 5 with a single ceramic substrate board 48, its top layer having the MMIC chip and RF interconnects (circuitry) 60 printed by thick film processing and/or other techniques thereon. The bottom layer includes a radio frequency and ground layer 62 formed on the other side of the ceramic substrate board. The electrical interconnects (circuitry) associated with the RF interconnects (circuitry) and are typically printed on top as shown by the circuitry 61 in FIG. 5.

In another aspect of the present invention, at least one row of ground vias 64 are formed within the substrate board and provide isolation between at least the transmitter and receiver sections 54, 58 formed on the substrate board. The vias 64 extend from the top portion of the substrate board through the substrate board to the radio frequency and ground layer 62. Ground vias 64 provide high isolation of greater than 70 decibels between the transmitter and receiver chains in the transceiver modules. The vias 64 are typically spaced about a quarter of a wavelength apart and the via density can be adjusted based on isolation requirements. In areas where lower isolation is tolerated, a single row of ground vias 64 could be spaced approximately 0.4 wavelengths apart. In those areas where higher isolation is required, a second, offset row of vias could be used.

In another aspect of the present invention, the single, ceramic substrate board 48 can be formed from about 90% to about 100% alumina, and in one preferred embodiment, is about 96% to 99% alumina. The board 48 can have different thicknesses ranging from about 5 to about 20 mil thick, and preferably about 10–15 mil thick, in one aspect of the present invention. Naturally, other materials besides ceramic can be used as suggested by those skilled in the art as long as the material performs the necessary functions and is an adequate substrate board.

As shown in FIG. 4, high frequency capacitors 66 can be embedded on the top surface of the ceramic substrate board. The embedded capacitors eliminate the requirement for conventional and high cost, metal plate capacitors used with high frequency MMIC chips. It is possible to add a resistance material to the capacitor dielectric material and optimize the capacitor resonant frequency. Surface mount (SMT) capacitors can also be adhered by epoxy to the top surface of the ceramic substrate board for applications where the embedded capacitor values are insufficient to prevent oscillations.

It is also possible to form thermal heat sink (or possibly RF) vias 68 that are filled with conductive material under the MMIC chips to achieve adequate electrical performance and improved thermal conductivity as shown in FIGS. 4 and 5. These vias 68 extend from the MMIC chip to the radio frequency and adhesion ground layer 62. If the MMIC chip is still generating excessive heat, a cut-out 70, such as formed from laser cutters, can be made within the ceramic substrate board to allow direct attachment of the MMIC chip to a coefficient of thermal expansion matched carrier or heat sink, which could be part of the bottom plate.

Figure 6:
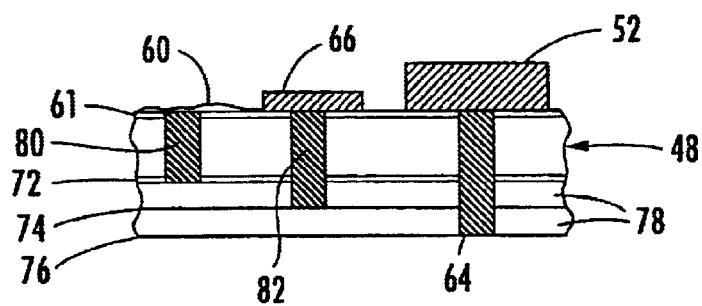
FIG. 6 is a fragmentary, sectional view of the substrate board that includes dielectric layers and conductive layers positioned on the substrate board.

FIG. 6 illustrates an embodiment where the single ceramic substrate board 48 includes a radio frequency ground layer 72. A DC circuitry layer 74 and an adhesion ground layer 76 are separated from the ceramic substrate board by two dielectric layers 78, as illustrated. A radio frequency via 80 is operatively connected from the radio frequency circuitry 61 to the radio frequency ground layer 72. A DC via 82 is operatively connected from an embedded capacitor 66 on the top surface of the substrate board to the DC circuitry layer 74. A thermal via 68 is operatively connected from the MMIC chip 52 through the ceramic substrate board 48 and the two dielectric layers 78 to the adhesion ground layer 76.

FIG. 4 also illustrates a 50 ohm microstrip line 86 as formed as part of the RF circuit 61 and a DC signal trace line 88 formed as an electrical interconnect (circuit). The transmitter and receiver sections 54, 58 include a DC and intermediate frequency connection pad 90 that is operatively connected by a 50 ohm microstrip lines and DC signal trace to various MMIC chips as part of the receiver and transmitter sections.

In one aspect of the present invention, the housing cover 46 includes an electromagnetic interference gasket 94 that is positioned on top of the ceramic board and around the MMIC chips supported by the substrate board when the housing cover is mounted on top of the bottom plate 44. The ceramic substrate board 48 also includes an electromagnetic interference ground contact strip 95 that surrounds the transmitter, receiver and local oscillator sections 58, 54, 56 and engages the gasket 94 when the housing cover is secured to the bottom plate 44.

As illustrated in FIG. 4, the transmitter, receiver and local oscillator sections 58, 54, 56 are formed substantially separated from each other to enhance isolation and reduce oscillations. The housing cover 46 includes an inside surface portion 46a that includes formed radio frequency channels 96. The electromagnetic interference gasket 94 is contained around the radio frequency channels, such that when the housing cover 46 is applied on the bottom plate 44, the gasket is received and mounted around the receiver, transmitter and local oscillator sections. It is also possible to include a radio frequency channel/echo absorbent material 98 that is mounted within the cover to aid in improving isolation and reducing possible isolations.

The radio frequency module layout is channelized in sections to provide high isolation and prevent possible oscillations. Channel neck-down can be used in key areas to improve isolation. As shown in FIG. 4, the transmitter, receiver and local oscillator sections 58, 54, 56 are formed relatively straight and narrow, as described before, and are positioned substantially separated from each other. This is especially applicable in high gain amplifier cascade applications.

Intermediate frequency, radio frequency and DC connections can transfer signals to and from the ceramic substrate board, as noted before. The DC and intermediate frequency signals can be transferred in and out of the ceramic substrate board using pressure contact connectors, such as high frequency self-adjusted subminiature coaxial connectors (SMA) shown in FIGS. 9–13 as disclosed in commonly assigned U.S. patent application Ser. No. 60/307,952, filed Jul. 26, 2001, the disclosure which is hereby incorporated by reference in its entirety. The SMA connectors can include basic components common to the illustrated connectors 100, including a standard SMA shell 102, either screw-mount or press fit; a dielectric material 104 sized for 50 ohms impedance (multiple configurations shown); a standard SMA connection 105; a contact tip 106 sized for 50 ohms impedance (multiple configurations shown); and a compliant, spring loaded intermediate contact 108.

The compliant, spring-loaded intermediate contact 108 is operable with a spring mechanism, such as a fuzz button or pogo pin, having two parts with a spring inside. One fuzz button could be a gold plated beryllium-copper wool that fills passages through a material to provide conductive pathways. A pogo pin could be a spring-loaded electrical connector adapted to contact and press against a surface and can include wires, pins or cables formed as spring segments or other resilient members as known to those skilled in the art.

Figure 7:
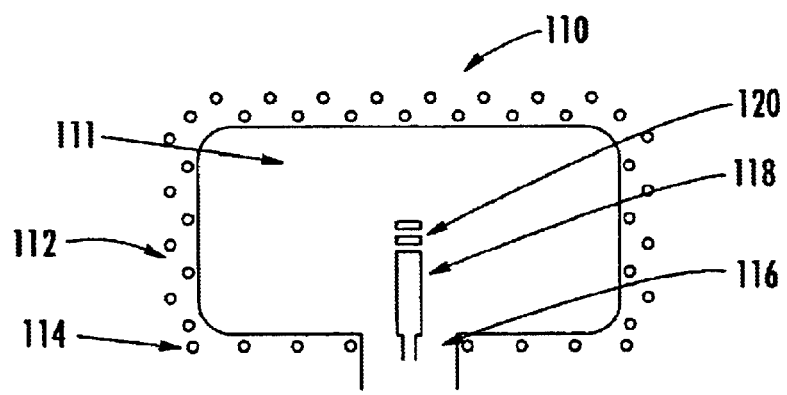
FIG. 7 is a fragmentary, plan view of a microstrip-to-waveguide transition used in the present invention.
Figure 8:
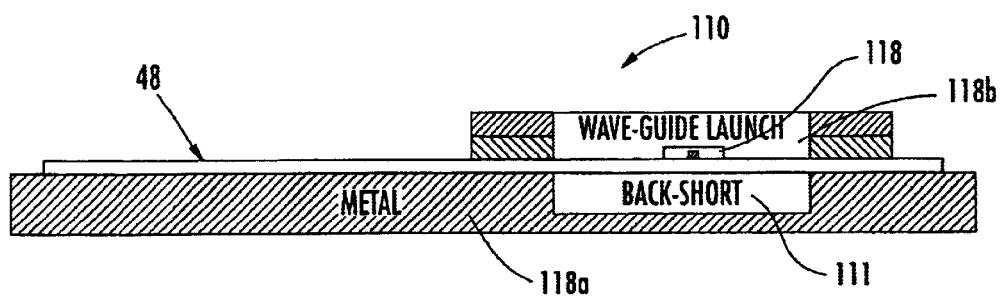
FIG. 8 is a fragmentary, sectional view of the microstrip-to-waveguide transition used in the present invention.
Figure 9:
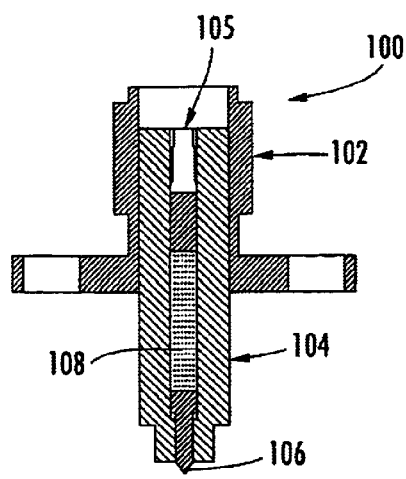
FIGS. 9–11 are sectional views showing three different, multiple variations of a self-adjusting, solderless subminiature coaxial connector (SMA) connector that can be used in the present invention
Figure 11:
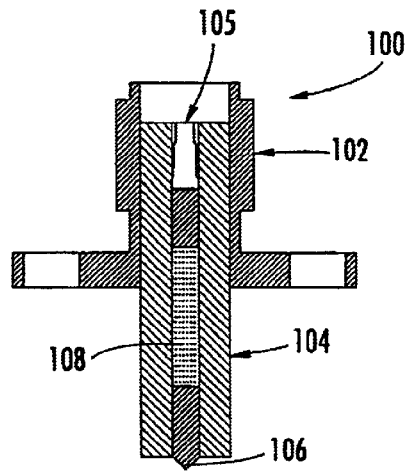
Figure 10:
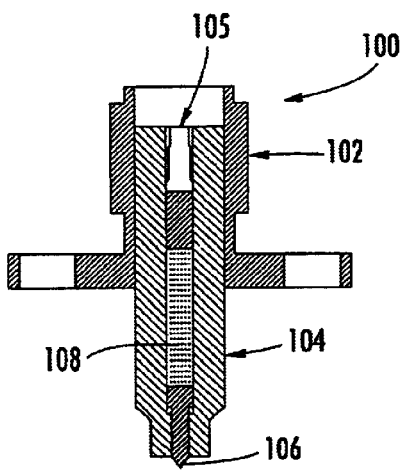
Figure 12:
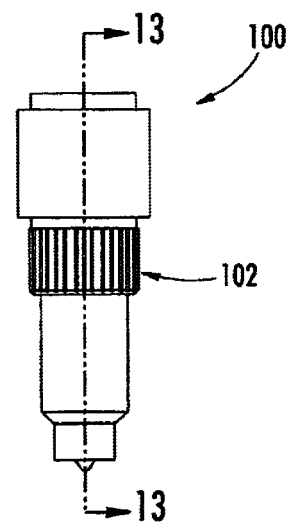
FIG. 12 is an elevation view of a solderless SMA connector similar to that shown in FIG. 10.
Figure 13:
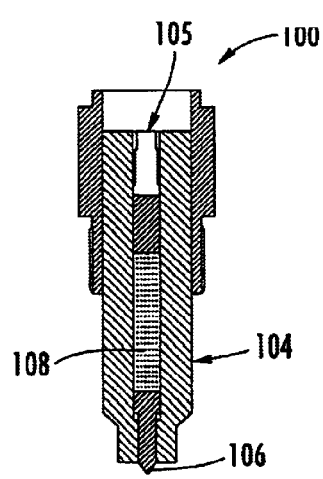
FIG. 13 is a sectional view of the SMA connector taken along line 13—13 of FIG. 12.

Radio frequency signals can be transferred in and out signal traces, such as microstrip, for the ceramic substrate board using a broadband, low loss, microstrip-to-waveguide transition 110 where no cuts in the ceramic are required to implement the transition. As shown in FIGS. 7 and 8, the transition 110 includes a channel or backshort 111 with a channel wall ground layer 112 formed thereon and ground vias 114. A reduced channel width feed 116 is operative with a microstrip probe section 118 as known to those skilled in the art, and a tuning section 120 illustrated as a pair of elements.

FIG. 8 illustrates a fragmentary sectional view of the transition 110 and shows the ceramic substrate board 48 having the backshort 111, including a formed metal section 118a and a waveguide launch 118b as part of the probe section 118. Manufacturing techniques known by those skilled in the art are used. Built up sections such as formed from thick film processing techniques could be used for the structure. In one aspect of the present invention, the depth of the backshort is a function of many things, including the dielectric constant of any material used for the substrate board and a function of the bandwidth that the system achieves. The backshort could typically be in the range of about 25 to 60 mils deep. The isolation vias, as illustrated, aid in the transition. The backshort can be formed on either side of the substrate board to facilitate assembly and reducing overall costs. If energy is to be propagated up into a waveguide, then the backshort would be placed on the bottom portion of the ceramic substrate board. Other components, as illustrated, could include a regulator controller board, DC connector and other component parts.

Figure 14:
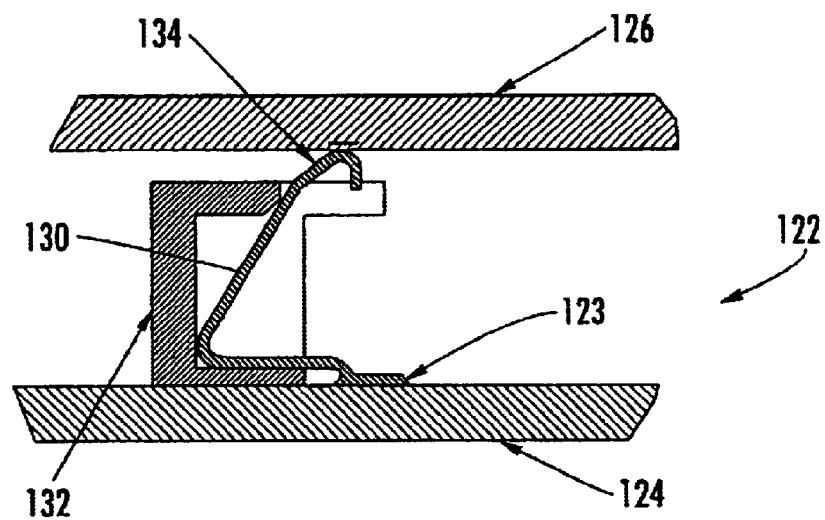
FIG. 14 is a sectional view of a surface mount pressure contact connector that can be used as modified for transferring radio frequency signals using a DC contact connector.
Figure 15:
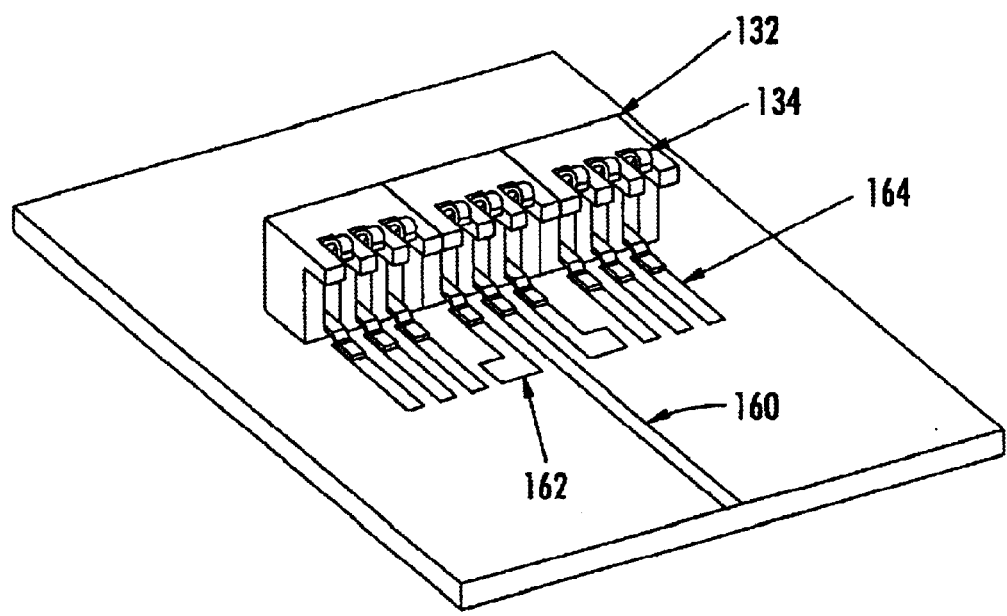
FIG. 15 is an isometric view of a connector that can be used as modified for transferring high frequency RF using DC contact connectors.

FIGS. 14 and 15 illustrate surface mount pressure contact connectors 122 that are commonly used to perform solderless connection, but could be modified for use as a connector for transferring high frequency RF signals. This type of surface mount connector as illustrated is widely available in the industry at low cost and has traditionally been used to transfer DC signals between stacked layers of printed circuit boards (PCB). One common application for this type of connector is in cellular telephones. A typical surface mount connector of this type can have 16–30 pins and the connector provides a reliable connection through a spring-loaded pressure contact. As illustrated in FIG. 14, the connector 122 is soldered by solder connection 123 to a surface of a first board 124. A ceramic board 126 fits under or over the first board and has metallized pads that align with connector pins. Contact is made by applying pressure on one of the two boards. This type of connector as illustrated is in the form of a spring clip 130 with a plastic housing 132 and a pressure contact 134. It is used in the industry by those skilled in the art.

FIG. 15 shows a structure using the connector transferring high frequency radio frequency. As illustrated, nine spring contacts 134 are shown as a ganged array of contact connectors with spring contacts. The spring contacts are soldered to a board and the upper contact engages by pressure to a second board (if used). A radio frequency signal line 160 of 50 ohms impedance is illustrated with a ground 162 at each side, as illustrated. DC and signal lines 164 are placed on either side of the ground line. Three consecutive pin connections are used: one pin connection for the radio frequency signal and the two pins on either side for ground signals. The radio frequency pin is connected directly to a 50 ohm line, and the two ground pins are connected to the ground signal on the board. The spacing between the pins can be about 50 mils and the DC signals are carried on other pins in the same connector. The solder connection 123 provides secured contact to the first board and the spring 134 can provide contact to another connector, board or contact by pressure on top.

A filter 59 can be formed as parallel coupled line filters produced using thick film processing techniques. For example, details of such filters can be found in commonly assigned and copending U.S. patent application Ser. No. 09/933,269, filed Aug. 20, 2001, entitled "MILLIMETER WAVE FILTER FOR SURFACE MOUNT APPLICATIONS," the disclosure which is hereby incorporated by reference in its entirety. A filter could be formed using alumina carrier plate acting as a on a surface and an outer filter surface formed by thick film processing techniques. A plurality of coupled line resonators can be formed as either stripline or microstrip and positioned on the outer filter surface. Radio frequency terminal contacts can be positioned on the surface opposite any layer formed by thick film processing techniques. Conductive vias can extend through the layers. Intervening ground plane layers could be used.

It is evident that the present invention provides an improvement over prior art techniques as shown in FIGS. 1 and 2 where MMIC chips and the substrates are mounted onto a coefficient of thermal expansion matched housing and adhesively secured thereto. The prior art includes various ribbon bonds, wire bonds, metal plate capacitors and associated components with the "chip and wire" fabrication techniques.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A millimeter wave (MMW) radio frequency transceiver module comprising:
    a substrate board;
    a plurality of microwave monolithic integrated circuit (MMIC) chips supported by the substrate board and arranged in a receiver section, a local oscillator section, and a transmitter section;
    a plurality of filters and radio frequency interconnects formed on the substrate board and operative with and/or connecting the receiver, local oscillator and transmitter sections; and
    a microstrip-to-waveguide transition formed at each of the transmitter and receiver sections.

2. A millimeter wave (MMW) radio frequency transceiver module according to claim 1, and further comprising electrical interconnects that are printed on the substrate board.

3. A millimeter wave (MMW) radio frequency transceiver module according to claim 1, and further comprising a dielectric layer and conductive layer formed on the substrate board opposite the MMIC chips and filters and radio frequency interconnects side, and further comprising electrical interconnects formed within the conductive layer, and a plurality of conductive vias extending from the electrical interconnects through the substrate board to the surface having the MMIC chips and filters and radio frequency interconnects.

4. A millimeter wave (MMW) radio frequency transceiver module according to claim 1, and further comprising a cutout formed within the substrate for receiving a MMIC chip for allowing direct attachment of the MMIC chip to a coefficient of thermal expansion (CTE) matched carrier or heat sink.

5. A millimeter wave (MMW) radio frequency transceiver module according to claim 1, and further comprising at least one row of ground vias formed within the substrate board and providing isolation between at least the transmitter and the receiver sections formed on the substrate board.

6. A millimeter wave (MMW) radio frequency transceiver module according to claim 1, wherein said transmitter, receiver and local oscillator sections are formed separated and sectioned from each other to enhance isolation and reduce oscillations.

7. A millimeter wave (MMW) radio frequency transceiver module according to claim 1, wherein each microstrip-to-waveguide transition comprises a backshort formed relative to the substrate board and a waveguide launch operative with the backshort, and a plurality of isolation vias.

8. A millimeter wave (MMW) radio frequency transceiver module according to claim 1, wherein said substrate board comprises a single ceramic board.

9. A millimeter wave (MMW) radio frequency transceiver module according to claim 8, wherein said single, ceramic board is from about 90 to about 99:6 percent alumina, and ranges from about 5 to about 20 mil thick.

10. A millimeter wave (MMW) radio frequency transceiver module comprising:
   housing having a bottom plate and housing cover attached to the bottom plate
   a single ceramic substrate board positioned on the bottom plate and covered by the housing cover;
   a plurality of microwave monolithic integrated circuit (MMIC) chips supported by the substrate board and arranged in a receiver section, a local oscillator section, and a transmitter section;
   a plurality of filters and radio frequency interconnects formed on the substrate board and operative with and/or connecting the receiver, local oscillator and transmitter sections; and
   a microstrip-to-waveguide transition formed at each of the transmitter and receiver sections.

11. A millimeter wave (MMW) radio frequency transceiver module according to claim 10, wherein the housing cover includes an electro-magnetic interference gasket that is positioned above and around MMIC chips supported by substrate board.

12. A millimeter wave (MMW) radio frequency transceiver module according to claim 10, and further comprising radio frequency channels formed in the cover and an absorber material operative with the channels to enhance isolation among the local oscillator, transmitter and receiver sections.

13. A millimeter wave (MMW) radio frequency transceiver module according to claim 10, wherein the housing cover includes SMA connectors having a solderless spring-loaded intermediate contact.

14. A millimeter wave (MMW) radio frequency transceiver module according to claim 10, and further comprising electrical interconnects that are printed on the substrate board.

15. A millimeter wave (MMW) radio frequency transceiver module according to claim 10, and further comprising a dielectric, layer and conductive layer formed on the substrate board opposite the MMIC chips and filters and radio frequency interconnects, and further comprising electrical interconnects formed within the conductive layer, and a plurality of conductive vias extending from the electrical interconnects through the substrate board to the surface having the MMIC chips and thick film printed filters and radio frequency interconnect.

16. A millimeter wave (MMW) radio frequency. transceiver module according to claim 10, and further comprising a cutout formed within the substrate for receiving a MMIC chip for allowing direct attachment of the MMIC chip to a coefficient of thermal expansion (CTE) matched carrier or heat sink.

17. A millimeter wave (MMW) radio frequency transceiver module according to claim 10, and further comprising at least one row of ground vias formed within the substrate board and providing isolation between at least the transmitter and the receiver sections formed on the substrate board.

18. A millimeter wave (MMW) radio frequency transceiver module according to claim 10, wherein said transmitter, receiver and local oscillator sections are formed substantially separated and sectioned from each other to enhance isolation and reduce oscillations.

19. A millimeter wave (MMW) radio frequency transceiver module according to claim 10, wherein each microstrip-to-waveguide transition comprises a backshort formed relative to the substrate board and a waveguide launch operative with the backshort, and a plurality of isolation vias.

20. A millimeter wave (MMW) radio frequency transceiver module according to claim 10, wherein said single ceramic board is from about 90 to about 99.6 percent alumina and ranges from about 5 to about 20 mil thick.

21. A method of forming a millimeter wave (MMW) radio frequency transceiver module comprising the steps of:
   forming a ceramic substrate board;
   mounting a plurality of microwave monolithic integrated circuit (MMIC) chips on the substrate board such that the MMIC chips are arranged in a receiver section, a transmitter section and a local oscillator section;
   forming a plurality of filters, radio frequency, and electrical interconnects that are operative with the receiver, local oscillator and transmitter sections; and
   forming a microstrip-to-waveguide transition at each of the transmitter and receiver sections.

22. A method according to claim 21, and further comprising the step of forming a dielectric layer and conductive layer on the substrate board opposite the MMIC chips and filters and radio frequency interconnects, forming electrical interconnects in the conductive layer, and forming conductive vias to extend from the electrical interconnects through the substrate board to the surface having the MMIC chips and filters and radio frequency interconnects.

23. A method according to claim 21, and further comprising the step of printing electrical interconnects on the substrate board.

24. A method according to claim 21, and further comprising the step of forming the ceramic substrate board about 90 to about 99.6 percent alumina and about 5 to about 20 mil thick.

25. A method according to claim 21, and further comprising the step of forming the transmitter, receiver, and local oscillator sections separated and sectioned from each other.

26. A method according to claim 21, and further comprising the step of forming ground vias to provide. isolation between at least the transmitter and receiver sections.

27. A method according to claim 22, and further comprising the step of forming the radio frequency interconnects and filters by thick film processing techniques.

28. A millimeter wave (MMW) radio transceiver module according to claim 1, and further comprising a plurality of embedded capacitors and resistors printed on the substrate board.

29. A millimeter wave (MMW) radio frequency transceiver module according to claim 10, and further comprising a plurality of embedded capacitors and resistors printed on the substrate board.

30. A millimeter wave (MMW) radio frequency transceiver, module comprising:
a single ceramic board;
a plurality of microwave monolithic integrated circuit (MMIC) chips supported by the substrate board and arranged in a receiver section, a local oscillator section, and a transmitter section;
a plurality of filters and radio frequency interconnects formed on the substrate board and operative with and/or connecting the receiver, local oscillator and transmitter sections; and
a microstrip-to-waveguide transition formed at each of the transmitter and receiver sections.

31. A millimeter wave (MMW) radio frequency transceiver module according to claim 30, and further comprising electrical interconnects that are printed on the substrate board.

32. A millimeter wave (MMW) radio frequency transceiver module according to claim 30, and further comprising a dielectric layer and conductive layer formed on the substrate board opposite the MMIC chips and filters and radio frequency interconnects side, and further comprising electrical interconnects formed within the conductive layer, and a plurality of conductive vias extending from the electrical interconnects through the substrate board to the surface having the MMIC chips and filters and radio frequency interconnects.

33. A millimeter wave (MMW) radio frequency transceiver module according to claim 30, and further comprising a cutout formed within the substrate for receiving a MMIC chip for allowing direct attachment of the MMIC chip to a coefficient of thermal expansion (CTE) matched carrier or heat sink.

34. A millimeter wave (MMW) radio frequency transceiver module according to claim 30, and further comprising at least one row of ground vias formed within the substrate board and providing isolation between at least the transmitter and the receiver sections formed on the substrate board.

35. A millimeter wave (MMW) radio frequency transceiver module according to claim 30, wherein said transmitter, receiver and local oscillator sections are formed separated and sectioned from each other to enhance isolation and reduce oscillations.

36. A millimeter wave (MMW) radio frequency transceiver module according to claim 30, wherein each microstrip-to-waveguide transition comprises a backshort formed relative to the substrate board and a waveguide launch operative with the backshort, and a plurality of isolation vias.

37. A millimeter wave (MMW) radio frequency transceiver module according to claim 30, wherein said single, ceramic board is from about 90 to about 99.6 percent alumina, and ranges from about 5 to about 20 mil thick.

38. A millimeter wave (MMW) radio frequency transceiver module comprising:
housing having a bottom plate and housing cover attached to the bottom plate;
a substrate board positioned on the bottom plate and covered by the housing cover;
a plurality of microwave monolithic integrated circuit (MMIC) chips supported by the substrate board and arranged in a receiver section, a local oscillator section, and a transmitter section;
a plurality of filters and radio frequency interconnects formed on the substrate board and operative with and/or connecting the receiver, local oscillator and transmitter sections; and
an electro-magnetic interference gasket on the cover that is positioned above and around MMIC chips supported by the substrate board.

39. A millimeter wave (MMW) radio frequency transceiver module comprising:
housing having a bottom plate and housing cover attached to the bottom plate, said cover including SMA connectors having a solderless spring-loaded intermediate contact;
a substrate board positioned on the bottom plate and covered by the housing cover;
a plurality of microwave monolithic integrated circuit (MMIC) chips supported by the substrate board and arranged in a receiver section, a local oscillator section, and a transmitter section; and
a plurality of filters and radio frequency interconnects formed on the substrate board and operative with and/or connecting the receiver, local oscillator and transmitter sections.

40. A millimeter wave (MMW) radio frequency transceiver module comprising:
housing having a bottom plate and housing cover attached to the bottom plate;
a substrate board positioned on the bottom plate and covered by the housing cover;
a plurality of microwave monolithic integrated circuit (MMIC) chips supported by the substrate board and arranged in a receiver section, a local oscillator section, and a transmitter section;
a plurality of filters and radio frequency interconnects formed on the substrate board and operative with and/or connecting the receiver, local oscillator and transmitter sections; and
a microstrip-to-waveguide transition formed at each of the transmitter an receiver sections.

41. A millimeter wave (MMW) radio frequency transceiver module according to claim 40, wherein the housing cover includes an electro-magnetic interference gasket that is positioned above and around MMIC chips supported by substrate board.

42. A millimeter wave (MMW) radio frequency transceiver module, according to claim 40, and further comprising radio frequency channels formed in the cover and an absorber material operative with the channels to enhance isolation among the local oscillator, transmitter and receiver sections.

43. A millimeter wave (MMW) radio frequency transceiver module according to claim 40, wherein the housing cover includes SMA connectors having a solderless spring-loaded intermediate contact.

44. A millimeter wave (MMW) radio frequency transceiver module according to claim 40, and further comprising electrical interconnects that are printed on the substrate board.

45. A millimeter wave (MMW) radio frequency transceiver module according to claim 40, and further comprising a dielectric layer and conductive layer formed on the substrate board opposite the MMIC chips and filters and radio frequency interconnects, and further comprising electrical interconnects formed within the conductive layer, and a plurality of conductive vias extending from the electrical interconnects through the substrate board to the surface having the MMIC chips and thick film printed filters and radio frequency interconnect.

46. A millimeter wave (MMW) radio frequency transceiver module according to claim 40, and further comprising a cutout formed within the substrate for receiving a MMIC chip for allowing direct attachment of the MMIC chip to a coefficient of thermal expansion (CTE) matched carrier or heat sink.

47. A millimeter wave (MMW) radio frequency transceiver module according to claim 40, and further comprising at least one row of ground vias formed within the substrate board and providing isolation between at least the transmitter and the receiver sections formed on the substrate board.

48. A millimeter wave (MMW) radio frequency transceiver module according to claim 40, wherein said transmitter, receiver and local oscillator sections are formed substantially separated and sectioned from each other to enhance isolation and reduce oscillations.

49. A millimeter wave (MMW) radio frequency transceiver module according to claim 40, wherein each microstrip-to-waveguide transition comprises a backshort formed relative to the substrate board and a waveguide launch operative with the backshort, and a plurality of isolation vias.

50. A millimeter wave (MMW) radio frequency transceiver module according to claim 40, wherein said substrate board comprises a single ceramic board.

51. A millimeter wave (MMW) radio frequency transceiver module according to claim 50, wherein said single ceramic board is from about 90 to about 9.9.6 percent alumina and ranges from about 5 to about 20 mil thick.

52. A millimeter wave (MMW) radio frequency transceiver module comprising:

housing having a bottom plate and housing cover attached to the bottom plate and, including radio frequency channels in the cover and an absorber material;

a substrate board positioned on the bottom plate and covered by the housing cover;

a plurality of microwave monolithic integrated circuit (MMIC) chips supported by the substrate board and arranged in a receiver section, a local oscillator section, and a transmitter section; and a plurality of filters and radio frequency interconnects formed on the substrate board and operative with and/or connecting the receiver, local oscillator and transmitter sections, wherein isolation among the receiver, local oscillator and transmitter sections is enhanced by said radio frequency channels and absorber material.

* * * * *

UNITED STATES PATENT AND TRADEMARK OFFICE
CERTIFICATE OF CORRECTION

PATENT NO.   : 6,788,171 B2
DATED        : September 7, 2004
INVENTOR(S)  : Ammar et al.

It is certified that error appears in the above-identified patent and that said Letters Patent is hereby corrected as shown below:

Column 9,
Line 15, delete "about 99:6 percent" substitute -- about 99.6 percent --

Column 14,
Line 1, delete "about 9.9.6 percent" substitute -- about 99.6 percent --

Signed and Sealed this

Twenty-fifth Day of January, 2005

JON W. DUDAS
*Director of the United States Patent and Trademark Office*